(12) United States Patent
Hofer et al.

(10) Patent No.: US 10,414,350 B2
(45) Date of Patent: Sep. 17, 2019

(54) CRASH DETECTION CIRCUIT FOR THE DETECTION OF A CRASH OF A VEHICLE

(71) Applicant: Samsung SDI Co., Ltd., Yongin-si, Gyeonggi-do (KR)

(72) Inventors: Maximilian Hofer, Hartberg (AT); Thomas Korherr, Hartberg (AT)

(73) Assignee: Samsung SDI Co., Ltd., Yongin-si (KR)

( * ) Notice: Subject to any disclaimer, the term of this patent is extended or adjusted under 35 U.S.C. 154(b) by 270 days.

(21) Appl. No.: 15/420,914

(22) Filed: Jan. 31, 2017

(65) Prior Publication Data

US 2018/0111572 A1 Apr. 26, 2018

(30) Foreign Application Priority Data

Oct. 26, 2016 (EP) .................................. 16195835

(51) Int. Cl.
*B60R 16/02* (2006.01)
*G01R 27/26* (2006.01)
*G01D 5/14* (2006.01)
*G01D 5/20* (2006.01)
*G01D 5/244* (2006.01)

(52) U.S. Cl.
CPC ............... *B60R 16/02* (2013.01); *G01D 5/14* (2013.01); *G01D 5/145* (2013.01); *G01D 5/20* (2013.01); *G01D 5/2013* (2013.01); *G01D 5/24466* (2013.01); *G01R 27/2611* (2013.01)

(58) Field of Classification Search
CPC .. B60R 16/02; G01D 5/24466; G01D 5/2013; G01D 5/20; G01D 5/14; G01D 5/145; G01R 27/2611

USPC ................................. 324/656, 654, 649, 600
See application file for complete search history.

(56) References Cited

U.S. PATENT DOCUMENTS

| 4,945,336 A | 7/1990 | Itoh et al. |
| 5,568,131 A | 10/1996 | Sakai et al. |
| 5,717,302 A | 2/1998 | Sakai et al. |

(Continued)

FOREIGN PATENT DOCUMENTS

| EP | 0723161 A1 | 7/1996 |
| KR | 10-2015-0118730 | 10/2015 |

OTHER PUBLICATIONS

EPO Extended Search Report dated Apr. 13, 2017, for corresponding European Patent Application No. 16195835.0 (8 pages).

*Primary Examiner* — Giovanni Astacio-Oquendo
(74) *Attorney, Agent, or Firm* — Lewis Roca Rothgerber Christie LLP

(57) ABSTRACT

Embodiments of the present invention provide a crash detection circuit for detecting a crash of a vehicle and including a transformer including a first inductor as a part of a crash signal generation circuit, and a second inductor as a part of a crash signal evaluation circuit, and galvanically isolated from the first inductor, a first comparator including an output, an inverting input coupled to a first terminal of the second inductor, and a non-inverting input electrically coupled to a second terminal of the second inductor, and a window comparator including a first input terminal electrically connected to the output of the first comparator for an input voltage to be evaluated, and two second input terminals for receiving reference voltages.

15 Claims, 5 Drawing Sheets

(56) References Cited

U.S. PATENT DOCUMENTS

| | | | | |
|---|---|---|---|---|
| 6,015,484 A * | 1/2000 | Martinchek | ............ | G01N 17/02 |
| | | | | 204/404 |
| 6,617,972 B2 * | 9/2003 | Takarada | ........... | G08B 21/0484 |
| | | | | 324/538 |
| 6,776,889 B2 * | 8/2004 | Atherton | ................ | G01N 17/02 |
| | | | | 204/404 |
| 7,309,414 B2 * | 12/2007 | Yang | ...................... | G01N 17/02 |
| | | | | 204/404 |
| 8,779,729 B2 * | 7/2014 | Shiraishi | ............ | G01R 31/3606 |
| | | | | 320/155 |
| 2012/0098518 A1 * | 4/2012 | Unagami | ............. | G01R 22/066 |
| | | | | 324/74 |
| 2013/0307551 A1 | 11/2013 | Makino | | |
| 2014/0327992 A1 | 11/2014 | Sykes | | |

\* cited by examiner

US 10,414,350 B2

CRASH DETECTION CIRCUIT FOR THE DETECTION OF A CRASH OF A VEHICLE

CROSS-REFERENCED TO RELATED APPLICATION

This patent application claims priority to, and the benefit of, European Patent Application No. 16195835.0, filed on Oct. 26, 2016, in the European Patent Office, the content of which is incorporated in its entirety herein by reference.

FIELD

Embodiments of the present invention relate to a crash detection circuit for the detection of a crash of a vehicle.

TECHNOLOGICAL BACKGROUND

In crash detection circuits used for the detection of a crash of a vehicle, optocoupler units are often arranged between a crash signal generation circuit and a crash signal evaluation circuit. The aforementioned optocoupler units serve to galvanically isolate the crash signal generation circuit of the vehicle from the electronics of the crash signal evaluation circuit of the vehicle. However, such approaches for crash detection, which are based on optocoupler units, are often relatively expensive, lack sufficient robustness, have a relatively short lifetime, and do not allow for transmittance of differentiated (e.g., positive and negative) signals, as signaling between the crash signal generation circuit and the crash signal evaluation circuit is solely performed via light pulses.

A crash detection circuit of the state of the art may suitably fulfill a plurality of conditions. According to a first condition (e.g., according to a so called no-fire condition), the crash detection circuit shall not detect a crash when a current in the crash signal generation circuit is smaller than or equal to about 0.4 A, and when a current impulse given in the crash signal generation circuit is less than or equal to about 5 A and has a duration that is less than or equal to about 4 μs.

According to a second condition (e.g., according to a so called fire condition), the crash detection circuit shall detect a crash when a current in the crash signal generation circuit is greater than or equal to about 1.75 A and less than or equal to about 40 A for a maximum duration of about 0.5 ms in an operating temperature range and when, for a duration that is less than or equal to 2 ms, a current given in the crash signal generation circuit is greater than or equal to about 1.2 A and has a duration that is less than or equal to about 4 μs.

In FIG. 1, the fire condition and the non-fire condition are illustrated in a coordinate system. The ordinate (e.g., the y-axis) of the coordinate system shows the current given within the crash signal generation circuit, and the abscissa (e.g., the x-axis) of the coordinate system shows the duration for which the respective current is given within the crash signal generation circuit. In FIG. 1, the dark areas illustrate an area in which the fire condition is fulfilled, and the bright areas illustrate an area in which the non-fire condition is fulfilled.

SUMMARY

One or more of the drawbacks of the prior art could be avoided or at least reduced by means of embodiments of the present invention.

A crash detection circuit is provided for the detection of a crash of a vehicle. The crash detection circuit includes An aspect of such a crash detection circuit is that it is less expensive than, and has a higher robustness than, alternative solutions of the state of the art (e.g. solutions using optocoupler units). Furthermore, such crash detection circuits have a longer lifetime, as more robust components come into use and are adapted to transmit positive and negative signals.

Furthermore, the window comparator may further include an output for a crash signal evaluation signal.

The reference voltages inputted into the second input terminals may define the size of the voltage window of the window comparator.

The crash detection circuit may further include a voltage divider circuit including at least two resistors connected in series, wherein a terminal of one of the at least two resistors is electrically connected to the non-inverting input of the first comparator. The use of such a voltage divider circuit together with the first comparator and the window comparator allows for the fire condition and the non-fire condition to be implemented within the crash detection circuit. In other words, the use of such a voltage divider circuit together with the first comparator and the window comparator allows for the crash detection circuit to output a signal indicating the detection of a crash when the fire condition is met, and to output a signal indicating that a crash was not detected when the non-fire condition is met. For this purpose, the values of the at least two resistors may be chosen such that the crash detection circuit is adapted to continuously control whether the fire condition or the non-fire condition is met.

Moreover, another terminal of one of the at least two resistors may be electrically connected to one of the two second input terminals of the window comparator, and another terminal of one of the at least two resistors may be electrically connected to the other one of the two second input terminals of the window comparator. In such an embodiment, the voltage window of the window comparator is defined by constant reference voltages provided by the voltage divider circuit, which allows for an efficient design of the crash detection circuit, as the resistors of the voltage divider circuit are used for a plurality of purposes.

The voltage divider circuit may include four series-connected resistors, wherein the non-inverting input of the first comparator is electrically connected to a terminal of one of the four resistors, wherein the aforementioned terminal electrically connects the second and the third resistors as counted from one of the outermost resistors of the four series-connected resistors. In such an embodiment, the threshold voltages or reference voltages defining the voltage window of the window comparator can be chosen in a more precise manner, as more resistors allow for a division of the voltage supplied to the voltage divider circuit into smaller fractions. All resistors of the voltage divider circuit may have the same value, dividing the voltage supplied to the voltage divider circuit into equal fractions. In such an embodiment, a potential that is equal to half the voltage supplied to the voltage divider circuit is supplied to the non-inverting input of the first comparator. The voltage divider circuit may include four series-connected resistors, wherein the non-inverting input of the first comparator is electrically connected to a terminal of one of the four resistors, wherein the aforementioned terminal electrically connects the first and the second resistor or the third and the fourth resistor as counted from one of the outermost resistors of the four series-connected resistors.

In an embodiment, one of the two second input terminals of the window comparator is electrically connected to a terminal of the first resistor, wherein the aforementioned terminal electrically connects the first resistor with the second resistor. The other one of the two second input terminals of the window comparator is electrically connected to a terminal of the third resistor, wherein the aforementioned terminal electrically connects the third resistor with the fourth resistor. In such an embodiment, the size of the voltage window of the window comparator is defined by the voltage that drops at the series connection of the second and third resistors. With such a realization, a crash detection circuit is provided that includes a cost-efficient design allowing for a reduction of components that come to use when compared to alternative realizations known in the state of the art.

In an embodiment, the terminal of the first resistor that is not connected to the second resistor is electrically connected to a first voltage potential, and the terminal of the fourth resistor that is not connected to the third resistor is electrically connected to a second voltage potential, the first voltage potential being greater than the second voltage potential. The terminal of the first resistor that is not connected to the second resistor is electrically connected to a first voltage potential, which may be equal to about 5V. Furthermore, the terminal of the fourth resistor that is not connected to the third resistor is electrically connected to a second voltage potential, which may be equal to the GND potential.

The second input terminal of the window comparator that is electrically connected to a terminal of the first resistor is an inverting input of the window comparator, and the second input terminal of the window comparator that is electrically connected to a terminal of the third resistor is a non-inverting input of the window comparator. In such a realization, the potential supplied to the inverting input of the window comparator denotes an upper border of the voltage window of the window comparator. Furthermore, the potential supplied to the non-inverting input of the window comparator denotes a lower border of the voltage window of the window comparator. In such an embodiment, the voltage at the output of the window comparator depends on the result of a comparison of the output voltage at the output of the first comparator with the voltages being supplied to the second input terminals of the second inductor, and thus being supplied to the upper and lower border of the voltage window of the window comparator. In other words, the window comparator compares the output voltage of the first comparator to the reference voltages inputted into the second input terminals of the window comparator. The window comparator outputs a low signal when the output voltage of the first comparator falls into the voltage window of the window comparator. Furthermore, the window comparator outputs a high signal when the output voltage of the first comparator falls out of the voltage window of the window comparator.

In an embodiment, the first comparator is an operational amplifier. Operational amplifiers have a low voltage offset, and are generally very precise amplifiers.

The crash detection circuit may further include a parallel circuit of a resistor and a capacitor, wherein the output of the first comparator is electrically connected to a first terminal of the parallel circuit, and wherein a second terminal of the parallel circuit is electrically connected to the inverting input of the first comparator. Such a parallel circuit in the feedback connection of the first comparator adapts and adjusts the time constant of the first comparator, allowing for the aforementioned implementation of the fire condition and the non-fire condition.

A resistor is connected in series to the first inductor. In such an embodiment, the resistance of the input clamps of the crash signal generation circuit is adapted.

In an embodiment, an additional resistor is arranged within the electrical connection between the inverting input of the first comparator and the terminal of the second inductor. Also this resistor is used to precisely adjust the time constant of the first comparator.

The transformer is a current transformer. In such an embodiment, the crash detection circuit is usable with existing, current generation sources present in vehicles, wherein such current generation sources are adapted to generate a current in case of a crash. The current generation source, for example, can be a current source that is the emulation of a crash signal according to a standard of a vehicle manufacturer.

In an alternative embodiment, the transformer is a voltage transformer. In such an embodiment, the crash detection circuit is usable with existing voltage sources present in vehicles, wherein such voltage sources are adapted to generate a voltage in case of a crash. The voltage source, for example, can be a voltage source that is the emulation of a crash signal according to a standard of a vehicle manufacturer.

At least one resistor is connected in series and/or in parallel to the first inductor. Such an embodiment is especially suited when the transformer is a voltage transformer. In such an embodiment, the at least one resistor may be used to limit the voltage supplied to the first inductor of the transformer.

Moreover, a vehicle including a crash detection circuit according to embodiments of the invention is provided. In such an embodiment, the crash detection of the vehicle is improved for the aforementioned reasons.

BRIEF DESCRIPTION OF THE DRAWINGS

Features will become apparent to those of ordinary skill in the art by describing in detail embodiments of the present invention with reference to the attached drawings, in which.

DETAILED DESCRIPTION

Figure 1:
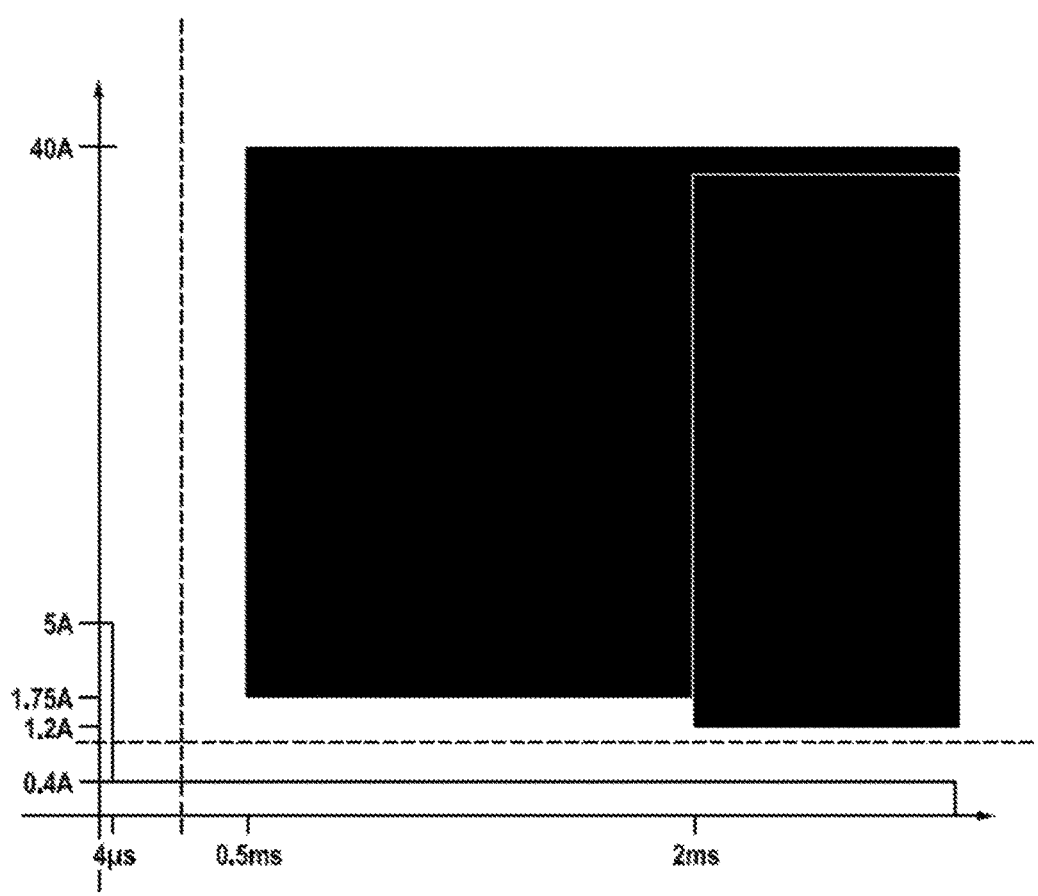
FIG. 1 shows a coordinate system with areas therein illustrating the fire condition and the non-fire condition.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
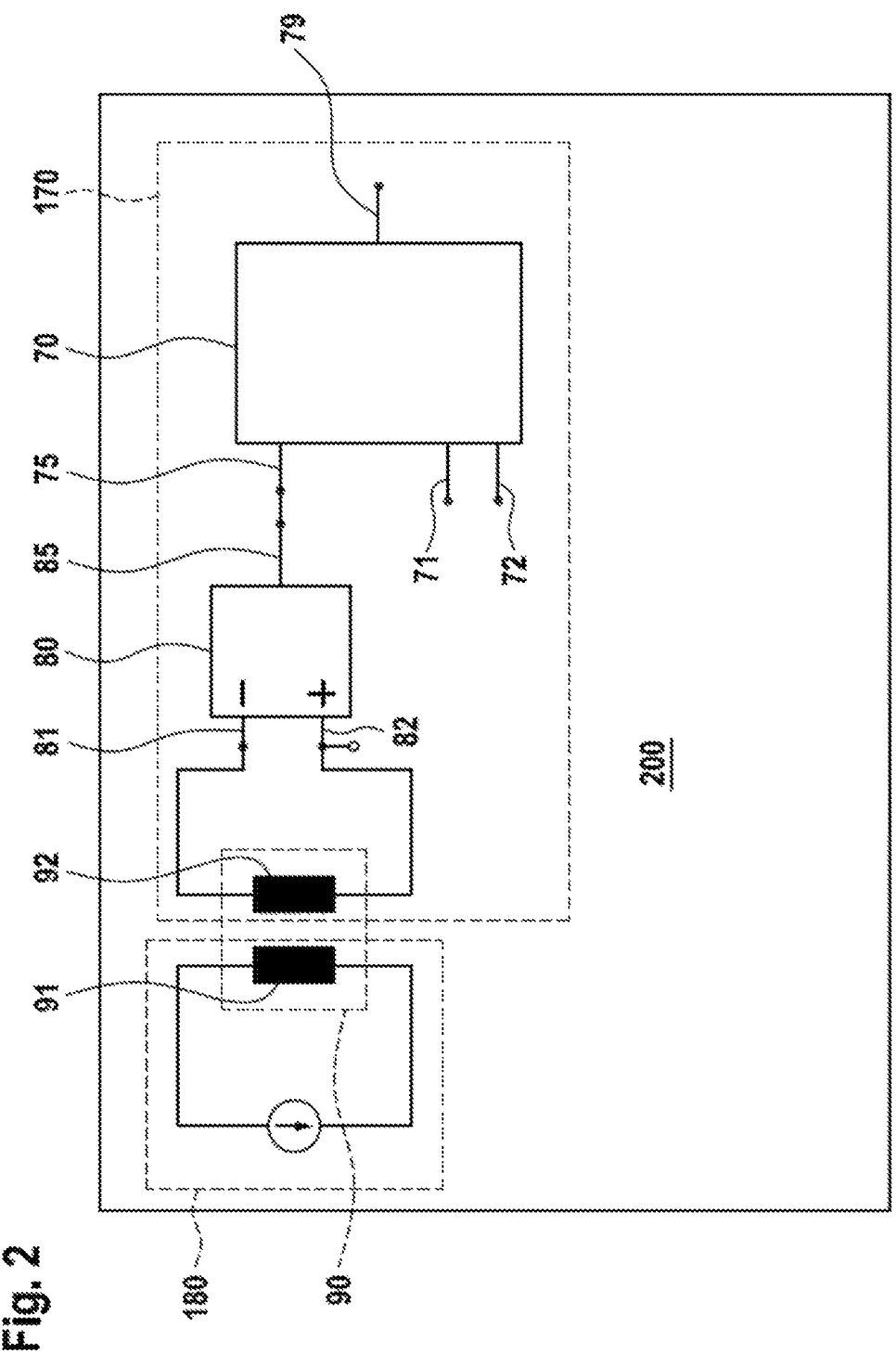
FIG. 2 illustrates a first embodiment of a crash detection circuit.

FIG. 2 illustrates a first embodiment of a crash detection circuit 200. In this first embodiment, the crash detection circuit 200 may be implemented into a vehicle, and adapted to detect a crash of the vehicle. The crash detection circuit 200 substantially comprises two sub-circuits that are galvanically isolated from each other. The first sub-circuit is a crash signal generation circuit 180 that is adapted to generate a crash signal. The crash signal can be represented by a current or by a voltage that can be generated by a current source or a voltage source, respectively. The second sub-circuit is a crash signal evaluation circuit 170 that is adapted to evaluate the signal generated by the crash signal generation circuit 180.

The crash detection circuit 200 comprises a transformer 90 that comprises a first inductor 91 forming a part of the crash signal generation circuit 180, and a second inductor 92 that forms a part of the crash signal evaluation circuit 170. The first and the second inductors 91 and 92 are galvanically isolated from and physically separated from each other. The crash detection circuit 200 further comprises a first comparator 80 that comprises an output 85, an inverting input 81 and a non-inverting input 82, each input 81 and 82 being respectively electrically coupled to one of the terminals of the second inductor 92 of the transformer 90. In other words, the inverting input 81 of the first comparator 80 is electrically connected to a first terminal of the second inductor 92, and the non-inverting input 82 is electrically connected to a second terminal of the second inductor 92.

Furthermore, the crash detection circuit 200 comprises a window comparator 70. The window comparator 70 comprises a first input terminal 75 for an input voltage to be evaluated, and comprises two second input terminals 71 and 72 for reference voltages $U_{ref1}$ and $U_{ref2}$. The reference voltages $U_{ref1}$ and $U_{ref2}$ define the size of the voltage window of the window comparator 70, and are supplied to the two second input terminals 71 and 72. The first reference voltage $U_{ref1}$ is supplied to the first of the two second input terminals 71, and defines an upper border of the voltage window of the window comparator 70. The second reference voltage $U_{ref2}$ is supplied to the second of the two second input terminals 72, and defines a lower border of the voltage window of the window comparator 70. In this first embodiment, the reference voltages $U_{ref1}$ and $U_{ref2}$ are constant, and are supplied by a component of the crash signal evaluation circuit 170. Moreover, in this first embodiment, the mean value $U_{mean}$ of the reference voltages $U_{ref1}$ and $U_{ref2}$ is supplied to the non-inverting input 82 of the first comparator 80, wherein the mean value $U_{mean}$ is equal to $(U_{ref1}+U_{ref2})/2$. In this first embodiment, the mean value $U_{mean}$ is supplied to the non-inverting input 82 of the first comparator 80 via the aforementioned component of the crash signal evaluation circuit 170. However, the mean value $U_{mean}$ can also be provided to the non-inverting input 82 via another component.

The output 85 of the first comparator 80 is electrically connected to the first input terminal 75 of the window comparator 70. Thus, the signal outputted by the output 85 of the first comparator 80 is compared to the reference voltages $U_{ref1}$ and $U_{ref2}$. In this first embodiment, the reference voltages are chosen such that the crash signal evaluation circuit 170 continuously evaluates whether the fire condition or the non-fire condition, as shown in the coordinate system of FIG. 1, is met. Thus, the window comparator 70 outputs a corresponding signal via its output 79 when the fire condition is met and a crash has been successfully detected.

Figure 3:
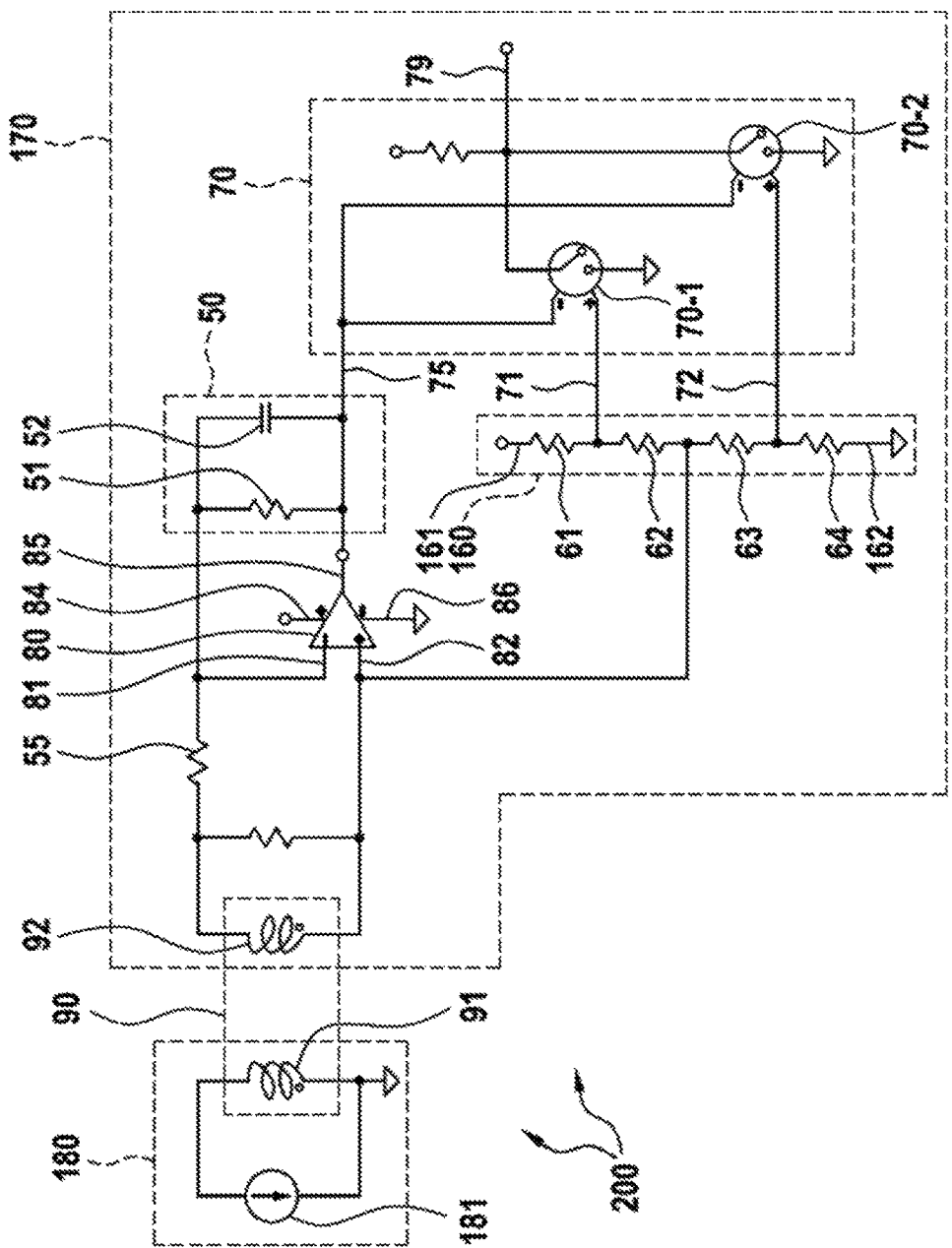
FIG. 3 illustrates a second embodiment of a crash detection circuit with a current transformer.

In FIG. 3, a second embodiment of a crash detection circuit 200 with a current transformer 90 is shown. Also in this second embodiment, the crash detection circuit 200 comprises a crash signal generation circuit 180 and a crash signal evaluation circuit 170. The crash signal generation circuit 180 comprises a current source 181 for the generation of a current corresponding to a crash signal. In FIG. 3, the current source 181 is shown as a single component. However, in other embodiments, the current within the crash signal generation circuit 180 can be generated via a plurality of components. Furthermore, the crash detection circuit 200 comprises a transformer 90, which is realized as a current transformer 90 in this second embodiment. Via the first inductor 91 of the current transformer 90, a current can be induced in the second inductor 92 that forms a part of the crash signal evaluation circuit 170. In this second embodiment, the first comparator 80 is realized as an operational amplifier, wherein the inverting input 81 of the operational amplifier is electrically connected to a first terminal of the second inductor 92, and wherein the non-inverting input 82 of the operational amplifier is electrically connected to a second terminal of the second inductor 92. A first power supply terminal 84 of the operational amplifier is electrically connected to a potential of about 5V, wherein the other power supply terminal 86 of the operational amplifier is electrically connected to a GND potential.

In this second embodiment, the crash signal evaluation circuit 170 further comprises a voltage divider circuit 160 that comprises four series-connected resistors 61, 62, 63, and 64. In other words, the voltage divider circuit 160 comprises a first terminal 161 electrically connected to a first resistor 61. This first resistor 61 is electrically connected to a second resistor 62, which is electrically connected to a third resistor 63. This third resistor 63 is electrically connected to a fourth resistor 64, which is electrically connected to a second terminal 162 of the voltage divider circuit 160. In this second embodiment, the first, second, third, and fourth resistor 61, 62, 63, and 64 have an identical value. However, in other embodiments, the values of the first, second, third, and fourth resistor 61, 62, 63, and 64 may differ from one another. Moreover, in other embodiments, the voltage divider circuit 160 can comprise three resistors, or can comprise more than four resistors.

Furthermore, in this second embodiment, the first terminal 161 of the voltage divider circuit 160 is electrically connected to a potential of, for example, about 5V, wherein the second terminal 162 of the voltage divider circuit 160 is electrically connected to, for example, the GND potential. However, the first and second terminals 161 and 162 of the voltage divider circuit 160 can also be connected to other potentials. In this second embodiment, the non-inverting input 82 of the first comparator 80 is electrically connected to a terminal of one of the four resistors 61, 62, 63, and 64, wherein the aforementioned terminal electrically connects the second and the third resistors 62 and 63, as counted from one of the outermost resistors 61 and 64 of the four series-connected resistors 61, 62, 63, and 64 (e.g., two inner resistors 62 and 63 of the four resistors 61, 62, 63, and 64). In other words, the non-inverting input 82 of the first comparator 80 is directly electrically connected to the terminals of the second and third resistor 62 and 63, that in this second embodiment have a potential of, for example, about 2.5V.

In this second embodiment, one of the two second input terminals 71 of the window comparator 70 is electrically connected to a terminal of the first resistor 61, wherein the aforementioned terminal electrically connects the first resistor 61 with the second resistor 62. In more detail, in this second embodiment, the first of the two second input terminals 71 of the window comparator 70, which may be an inverting input terminal of the window comparator 70, is directly electrically connected to the terminals of the first and second resistor 61 and 62. Moreover, in this second embodiment, the second of the two second input terminals 72 of the window comparator 70, which may be a non-inverting input terminal of the window comparator 70, is directly electrically connected to the terminal of the third resistor 63 that is directly connected to the fourth resistor 64. In more detail, in this second embodiment, the second of the two second input terminals 72 of the window comparator 70, which may be a non-inverting input terminal of the window comparator 70, is directly electrically connected to the terminals of the third and fourth resistor 63 and 64.

In this second embodiment, the voltage drop across the second and third resistors 62 and 63 determines the size of the voltage window of the window comparator 70 that has a span of, for example, about 2.5V.

The output 85 of the first comparator 80 is electrically connected to the first input terminal 75 of the window comparator 70. The window comparator 70 comprises two further comparators 70-1 and 70-2 that also can be operational amplifiers. However, also other and/or additional comparators can come to use, the other/additional comparators together forming a window comparator 70.

The crash detection circuit 200 further comprises a parallel circuit 50 of a resistor 51 and a capacitor 52, wherein the output 85 of the first comparator 80 is electrically connected to a first terminal of the parallel circuit 50, and wherein a second terminal of the parallel circuit 50 is electrically connected to the inverting input 81 of the first comparator 80. In other words, the parallel circuit 50 is arranged within the feedback circuit of the first comparator 80. Moreover, an additional resistor 55 is arranged within the electrical connection between the inverting input 81 of the first comparator 80 and the terminal of the second inductor 92. Via the parallel circuit 50 and the additional resistor 55, the time constant of the operational amplifier may be adjusted according to the non-fire condition and the fire condition as illustrated in FIG. 1.

Via the output 79 of the window comparator 70, the crash signal evaluation circuit 170 outputs an output signal that is determined according to the evaluation.

Figure 4:
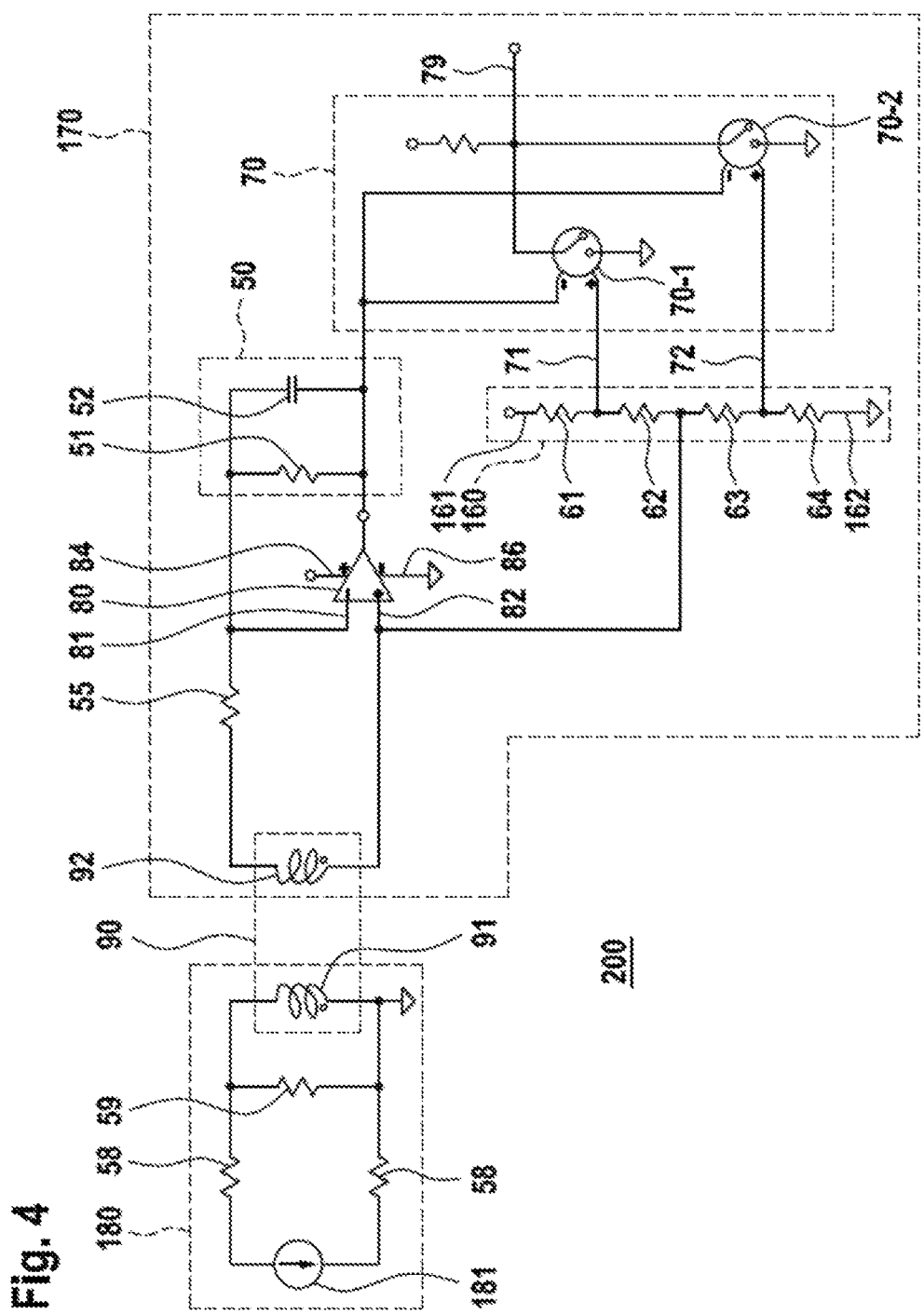
FIG. 4 illustrates a third embodiment of a crash detection circuit with a voltage transformer.

FIG. 4 illustrates a third embodiment of a crash detection circuit 200 with a voltage transformer 90. The crash detection circuit 200 shown in FIG. 4 is substantially identical to the crash detection circuit 200 shown in FIG. 3. However, as in this third embodiment, a voltage transformer 90 comes to use, and the crash signal generation circuit 180 is therefore adapted. Thus, in this third embodiment, two resistors 58 are connected in series to the first inductor 91 of the voltage transformer 90, wherein an additional resistor 59 is connected in parallel to the first inductor 91 of the voltage transformer 90.

Figure 5:
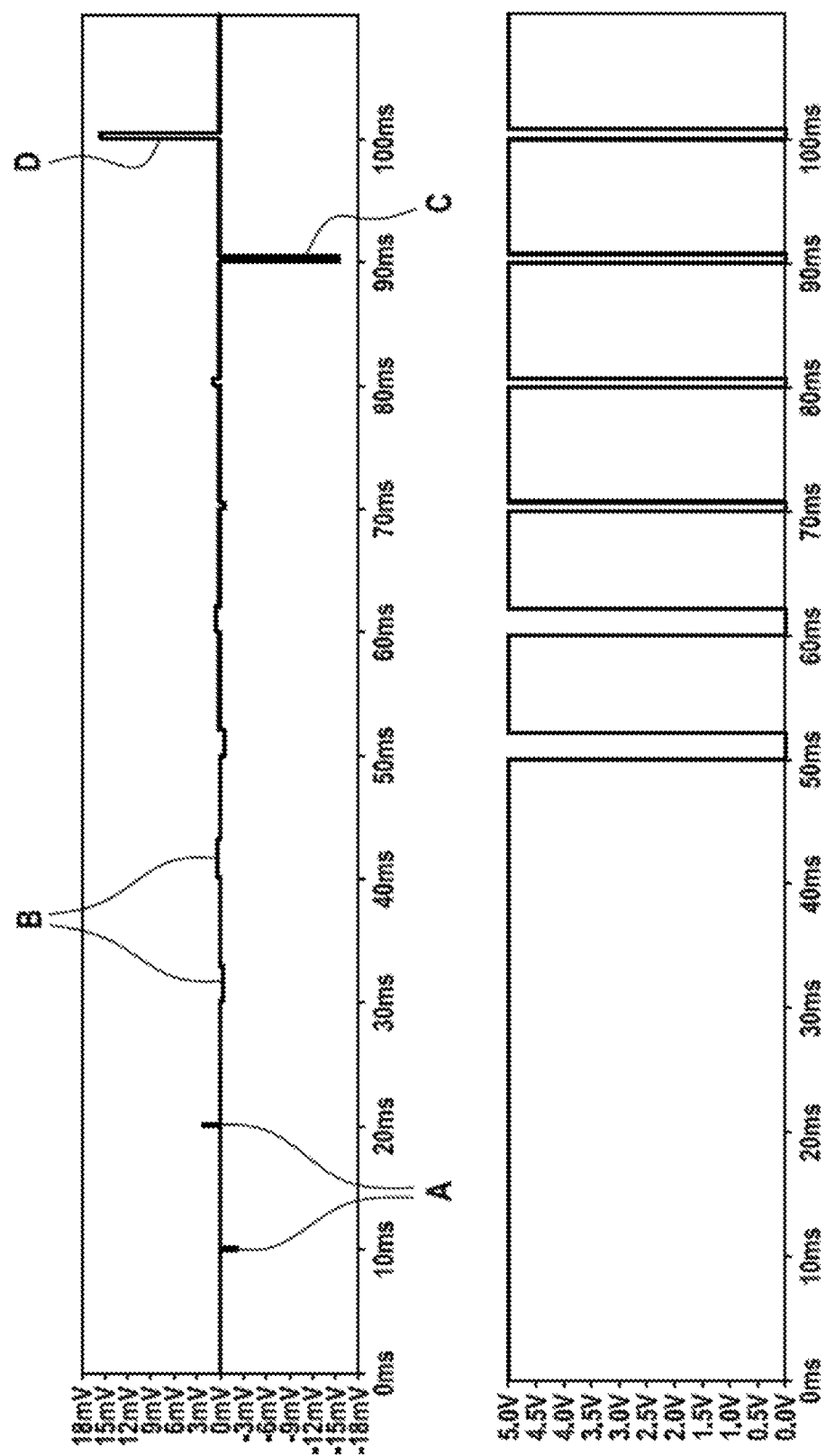
FIG. 5 illustrates a simulation using the second embodiment of a crash detection circuit.

In FIG. 5, a simulation is illustrated using the second embodiment of a crash detection circuit 200. In more detail, two diagrams are shown in FIG. 5. The upper diagram shows different crash pulses that are given as an input for the crash detection circuit 200 within the crash signal generation circuit 180. The lower diagram shows the evaluation of the crash detection circuit 200 at its output 79. It can be seen from FIG. 5 that the crash pulses denoted A have a duration that is too short to fulfill the fire condition (see FIG. 1), while the crash pulses denoted B have a current amplitude that is too low to fulfill the fire condition (see FIG. 1), as no output signal is generated to be outputted at the output 79 of the crash detection circuit 200.

However, this is not the case for the crash pulses C and D, which fulfill the fire condition (see FIG. 1), as pulses are outputted at the output 79 of the crash detection circuit 200, the pulses being visible within the lower diagram.

What is claimed is:

1. A crash detection circuit for detecting a crash of a vehicle and comprising:
   a crash signal generation circuit which is adapted to generate a crash signal; and
   a crash signal evaluation circuit coupled with the crash signal generation circuit via a transformer,
   wherein the transformer comprises:
      a first inductor as a part of the crash signal generation circuit; and
      a second inductor as a part of the crash signal evaluation circuit, and galvanically isolated from the first inductor,
   wherein the crash signal evaluation circuit is adapted to evaluate the crash signal generated by the crash signal generation circuit and further comprises:
      a first comparator comprising an output, an inverting input coupled to a first terminal of the second inductor, and a non-inverting input electrically coupled to a second terminal of the second inductor; and
      a window comparator comprising
         a first input terminal electrically connected to the output of the first comparator for an input voltage to be evaluated, and
         two second input terminals for receiving reference voltages.

2. The crash detection circuit of claim 1, wherein the first comparator comprises an operational amplifier.

3. The crash detection circuit of claim 1, further comprising a parallel circuit comprising a resistor and a capacitor, wherein the output of the first comparator is electrically connected to a first terminal of the parallel circuit, and wherein a second terminal of the parallel circuit is electrically connected to the inverting input of the first comparator.

4. The crash detection circuit of claim 1, further comprising an additional resistor between the inverting input of the first comparator and the second inductor.

5. The crash detection circuit of claim 1, wherein the transformer comprises a current transformer.

6. The crash detection circuit of claim 1, wherein the transformer comprises a voltage transformer.

7. The crash detection circuit of claim 6, further comprising at least one resistor is connected in series and/or in parallel to the first inductor.

8. A vehicle including the crash detection circuit of claim 1.

9. A crash detection circuit for detecting a crash of a vehicle and comprising:
   a transformer comprising:
      a first inductor as a part of a crash signal generation circuit; and
      a second inductor as a part of a crash signal evaluation circuit, and galvanically isolated from the first inductor;
   a first comparator comprising:
      an output;
      an inverting input coupled to a first terminal of the second inductor; and
      a non-inverting input electrically coupled to a second terminal of the second inductor;
   a window comparator comprising:
      a first input terminal electrically connected to the output of the first comparator for an input voltage to be evaluated; and two second input terminals for receiving reference voltages; and a voltage divider circuit comprising at least two resistors connected in series, wherein a first terminal of one of the at least two resistors is electrically connected to the non-inverting input of the first comparator.

10. The crash detection circuit of claim 9, wherein a second terminal of the one of the at least two resistors is electrically connected to a first of the two second input terminals of the window comparator, and wherein a third terminal of one of the at least two resistors is electrically connected to a second of the two second input terminals of the window comparator.

11. The crash detection circuit of claim 9, wherein the at least two resistors comprise four series-connected resistors, wherein the first terminal that is connected to the non-inverting input electrically connects two inner resistors of the four series-connected resistors.

12. The crash detection circuit of claim 11, wherein a first of the two second input terminals of the window comparator is electrically connected to a terminal of a first resistor of the four series-connected resistors that is electrically connected to a second resistor of the four series-connected resistors.

13. The crash detection circuit of claim 12, wherein a second of the two second input terminals of the window comparator is electrically connected to a terminal of a third resistor of the four series-connected resistors that is electrically connected to a fourth resistor of the four series-connected resistors.

14. The crash detection circuit of claim 13, wherein the first of the two second input terminals of the window comparator comprises an inverting input of the window comparator, and wherein the second of the two second input terminals of the window comparator comprises a non-inverting input of the window comparator.

15. The crash detection circuit of claim 11, wherein a terminal of a first resistor of the four series-connected resistors that is not connected to a second resistor of the four series-connected resistors is electrically connected to a first voltage potential, and wherein a terminal of a fourth resistor of the four series-connected resistors that is not connected to a third resistor of the four series-connected resistors is electrically connected to a second voltage potential that is less than the first voltage potential.

* * * * *